United States Patent
Imamura et al.

(10) Patent No.: US 9,184,177 B2
(45) Date of Patent: Nov. 10, 2015

(54) SEMICONDUCTOR DEVICE AND METHOD FOR MANUFACTURING THE SAME

(71) Applicant: Kabushiki Kaisha Toshiba, Minato-ku (JP)

(72) Inventors: Takeshi Imamura, Yokkaichi (JP); Tsuneo Uenaka, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/482,605

(22) Filed: Sep. 10, 2014

(65) Prior Publication Data

US 2015/0255484 A1  Sep. 10, 2015

(30) Foreign Application Priority Data

Mar. 6, 2014  (JP) ................................ 2014-043835

(51) Int. Cl.
| | |
|---|---|
| H01L 27/115 | (2006.01) |
| H01L 23/528 | (2006.01) |
| H01L 23/532 | (2006.01) |
| H01L 21/02 | (2006.01) |
| H01L 21/311 | (2006.01) |
| H01L 29/66 | (2006.01) |
| H01L 29/792 | (2006.01) |

(52) U.S. Cl.
CPC ...... *H01L 27/11582* (2013.01); *H01L 21/0217* (2013.01); *H01L 21/0228* (2013.01); *H01L 21/02164* (2013.01); *H01L 21/02183* (2013.01); *H01L 21/02271* (2013.01); *H01L 21/31116* (2013.01); *H01L 23/528* (2013.01); *H01L 23/53295* (2013.01); *H01L 27/1157* (2013.01); *H01L 27/11556* (2013.01); *H01L 29/66833* (2013.01); *H01L 29/792* (2013.01); *H01L 29/7926* (2013.01)

(58) Field of Classification Search
CPC .............. H01L 27/1157; H01L 29/792; H01L 29/66833; H01L 29/7926; H01L 27/11582
See application file for complete search history.

(56) References Cited

U.S. PATENT DOCUMENTS

| | | | |
|---|---|---|---|
| 7,799,672 | B2 | 9/2010 | Hashimoto et al. |
| 7,989,880 | B2 | 8/2011 | Wada et al. |
| 8,304,348 | B2 | 11/2012 | Hashimoto |

(Continued)

FOREIGN PATENT DOCUMENTS

| | | |
|---|---|---|
| JP | 2010-192646 A | 9/2010 |
| JP | 2010-199311 A | 9/2010 |
| JP | 2011-35237 A | 2/2011 |

*Primary Examiner* — Joseph C Nicely

(74) *Attorney, Agent, or Firm* — Oblon, McClelland, Maier & Neustadt, L.L.P.

(57) ABSTRACT

A semiconductor device according to an embodiment includes a stacked body, a second insulating film, a third insulating film and a plurality of contacts. The stacked body includes alternatively stacked electrode films and first insulating films, and has an end portion in which a terrace is formed for each pair of the electrode film and the first insulating film. The second insulating film covers the upper faces and the lower faces of the electrode films in the end portion of the stacked body. The second insulating film has a composition different from the composition of the first insulating film. The third insulating film is provided on the end portion of the stacked body. The third insulating film has a composition different from the composition of the second insulating film. The contact passes through the third insulating film and the second insulating film, and contacts the electrode film.

15 Claims, 10 Drawing Sheets

(56) References Cited

U.S. PATENT DOCUMENTS

| | | | |
|---|---|---|---|
| 8,759,162 B2 | 6/2014 | Wada et al. | |
| 8,890,229 B2* | 11/2014 | Watanabe | 257/314 |
| 8,912,593 B2* | 12/2014 | Matsuda | 257/324 |
| 2007/0252201 A1* | 11/2007 | Kito et al. | 257/331 |
| 2009/0230458 A1* | 9/2009 | Ishiduki et al. | 257/324 |
| 2009/0242968 A1* | 10/2009 | Maeda et al. | 257/324 |
| 2010/0059811 A1* | 3/2010 | Sekine et al. | 257/324 |
| 2010/0207240 A1* | 8/2010 | Hashimoto et al. | 257/532 |
| 2011/0031546 A1 | 2/2011 | Uenaka et al. | |
| 2012/0112171 A1* | 5/2012 | Hattori et al. | 257/40 |
| 2012/0171861 A1* | 7/2012 | Park et al. | 438/639 |
| 2012/0184078 A1* | 7/2012 | Kiyotoshi | 438/268 |
| 2013/0015520 A1* | 1/2013 | Shosuke et al. | 257/324 |
| 2013/0062683 A1* | 3/2013 | Fukuzumi et al. | 257/324 |
| 2013/0130468 A1* | 5/2013 | Higashitani et al. | 438/382 |
| 2015/0061068 A1* | 3/2015 | Akutsu et al. | 257/499 |
| 2015/0194441 A1* | 7/2015 | Yatsuda et al. | 438/587 |

\* cited by examiner

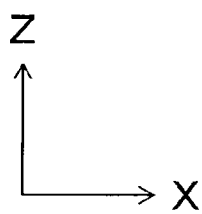
FIG. 3A
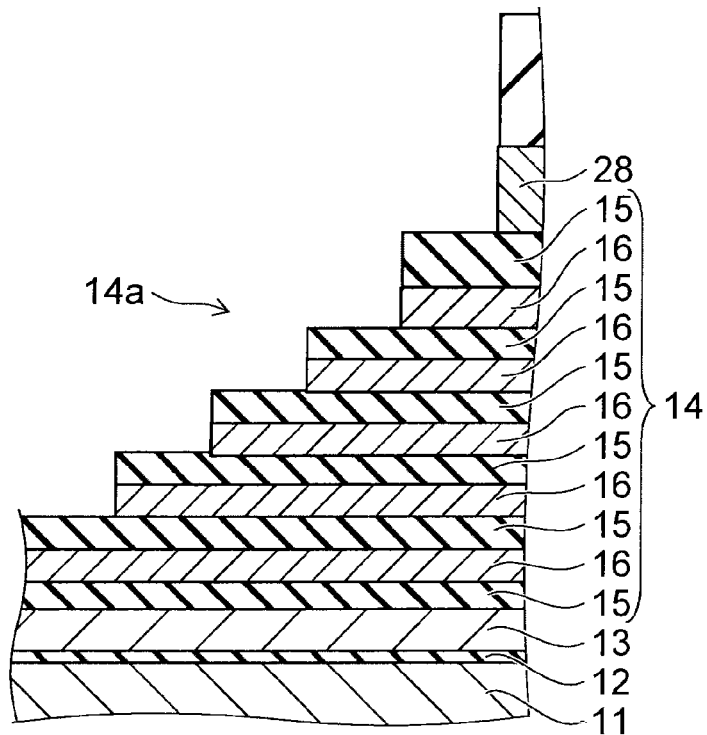
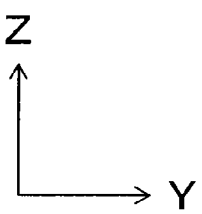
FIG. 3B
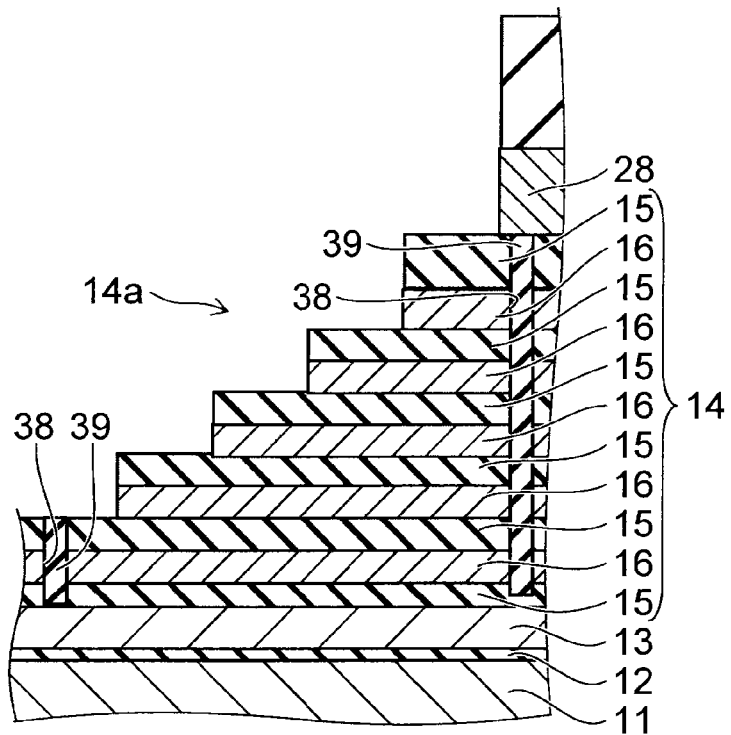

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2014-043835, filed on Mar. 6, 2014; the entire contents of which are incorporated herein by reference.

FIELD

Embodiments described herein relate generally to a semiconductor device and a method for manufacturing the same.

BACKGROUND

Conventionally, a stacked-type memory device is proposed in which a semiconductor pillar passes through a stacked body in which electrode films and insulating films are alternately stacked, and a charge storage layer is provided between the semiconductor pillar and the electrode films. In this type of memory device, the end portion of the stacked body is processed in a stairs form, the end portion is covered with an interlayer insulating film, and then a contact is dropped from above the interlayer insulating film toward the electrode film at each step in order to enable wiring to be taken out from the electrode films. However, the height of the contact required varies depending on the position of the electrode film, so it is difficult to form the contact holes through the interlayer insulating film at the same time.

BRIEF DESCRIPTION OF THE DRAWINGS

FIGS. 3A and 3B to FIGS. 8A and 8B are cross-sectional views illustrating a method for manufacturing the semiconductor device according to the first embodiment;

DETAILED DESCRIPTION

A semiconductor device according to an embodiment includes a stacked body, a second insulating film, a third insulating film and a plurality of contacts. The stacked body includes alternatively stacked electrode films and first insulating films, and has an end portion in which a terrace is formed for each pair of one of the electrode films and one of the first insulating films. The second insulating film covers the upper faces and the lower faces of the electrode films in the end portion of the stacked body. The second insulating film has a composition different from the composition of the first insulating film. The third insulating film is provided on the end portion of the stacked body. The third insulating film has a composition different from the composition of the second insulating film. Each of the plurality of contacts passes through the third insulating film and the second insulating film, and contacts each of the electrode films.

A method for manufacturing a semiconductor device according to an embodiment includes forming a stacked body by alternately stacking electrode films and first insulating films. The method includes forming a terrace for each pair of one of the electrode films and one of the first insulating films in an end portion of the stacked body. The method includes removing the first insulating films from the end portion of the stacked body. The method includes forming a second insulating film having a composition different from the composition of the first insulating film so as to contact the upper faces and the lower faces of the end portions of the electrode films. The method includes forming a third insulating film having a composition different from the composition of the second insulating film on the end portion of the stacked body. The method includes forming a plurality of contact holes at the same time that pass through the third insulating film and the second insulating film from above and reach each of the electrode films. And, the method includes filling the contact holes with electrically conductive material. The forming the contact holes includes etching under the condition so that the etching selectivity of the second insulating film with respect to the electrode films is higher than the etching selectivity of the first insulating films with respect to the electrode films.

First Embodiment

Hereinafter, embodiments of the invention will be described below with reference to the drawings.

First, a first embodiment will be described.

Figure 1:
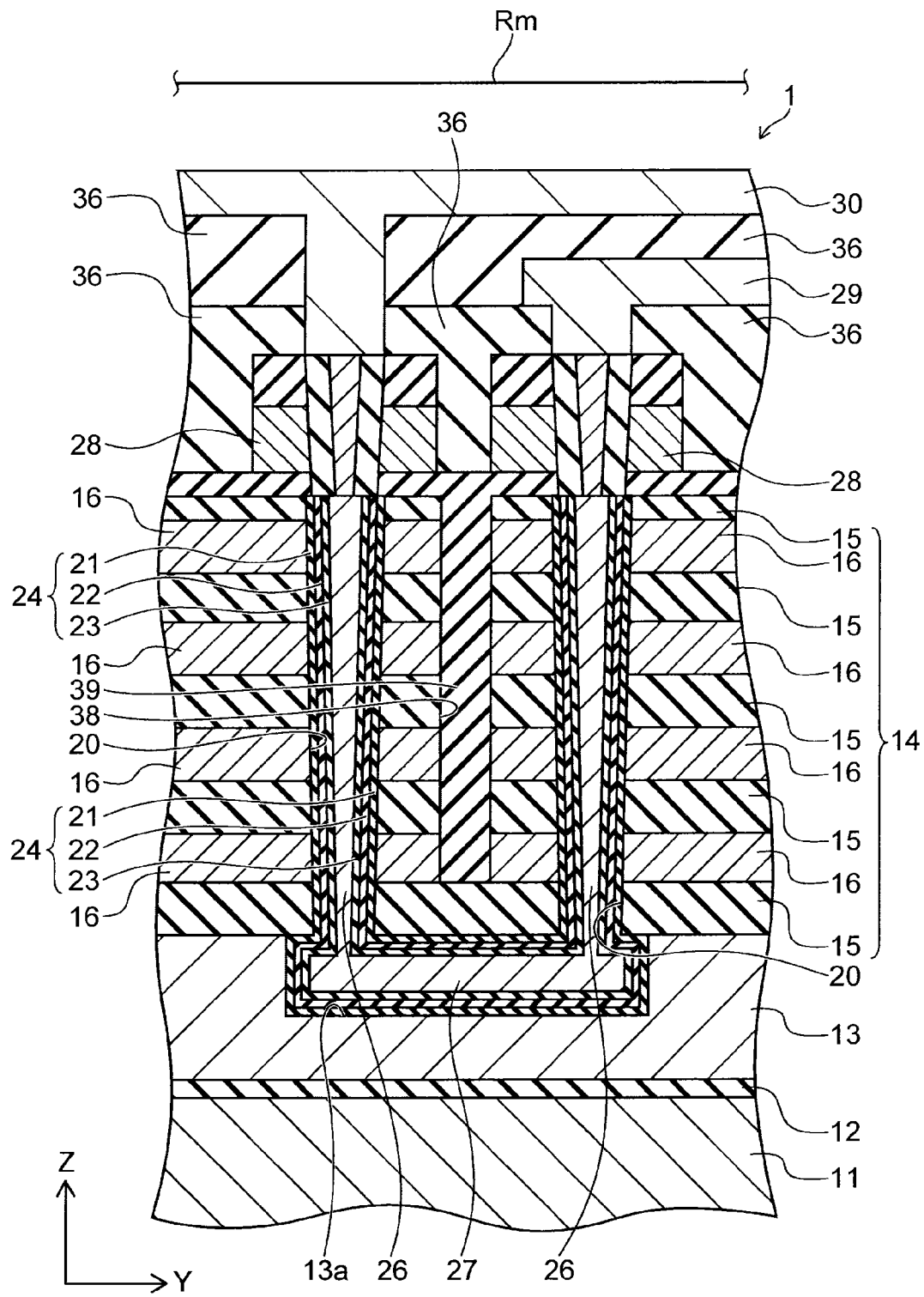
FIG. 1 is a cross-sectional view illustrating a memory region of a semiconductor device according to a first embodiment.

FIG. 1 is a cross-sectional view illustrating the memory region of a semiconductor device according to the embodiment.

Figure 2A:
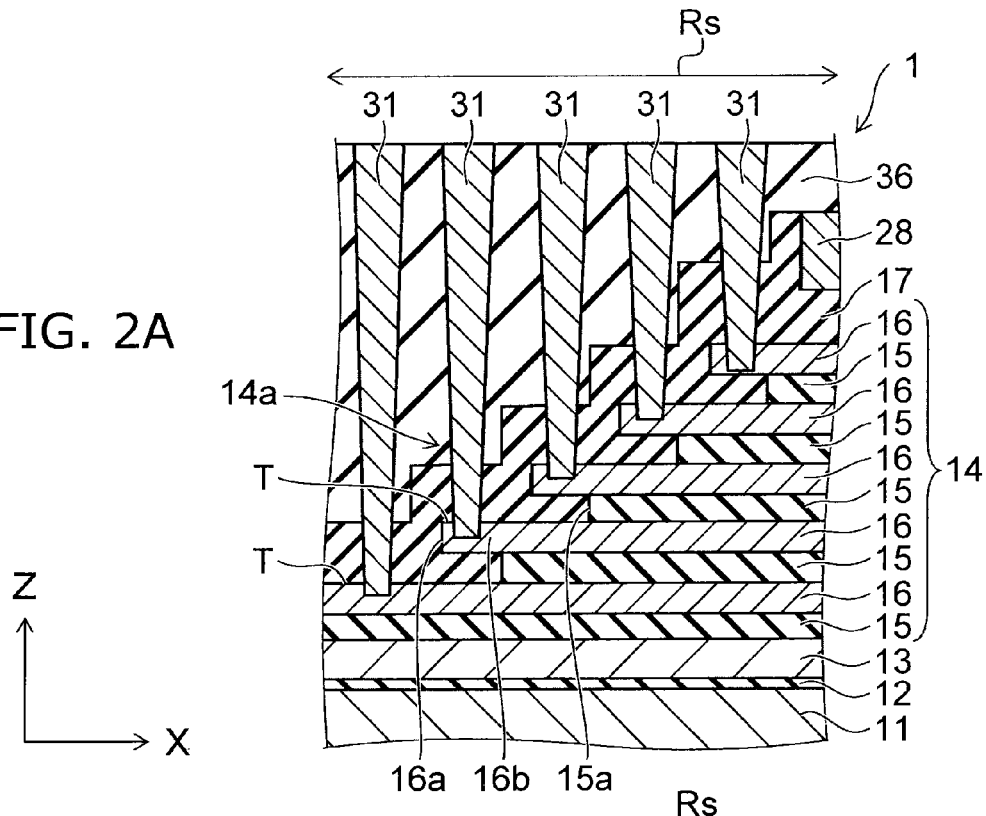
FIGS. 2A and 2B are cross-sectional views perpendicular to each other illustrating stairs region of the semiconductor device according to the first embodiment.
Figure 2B:
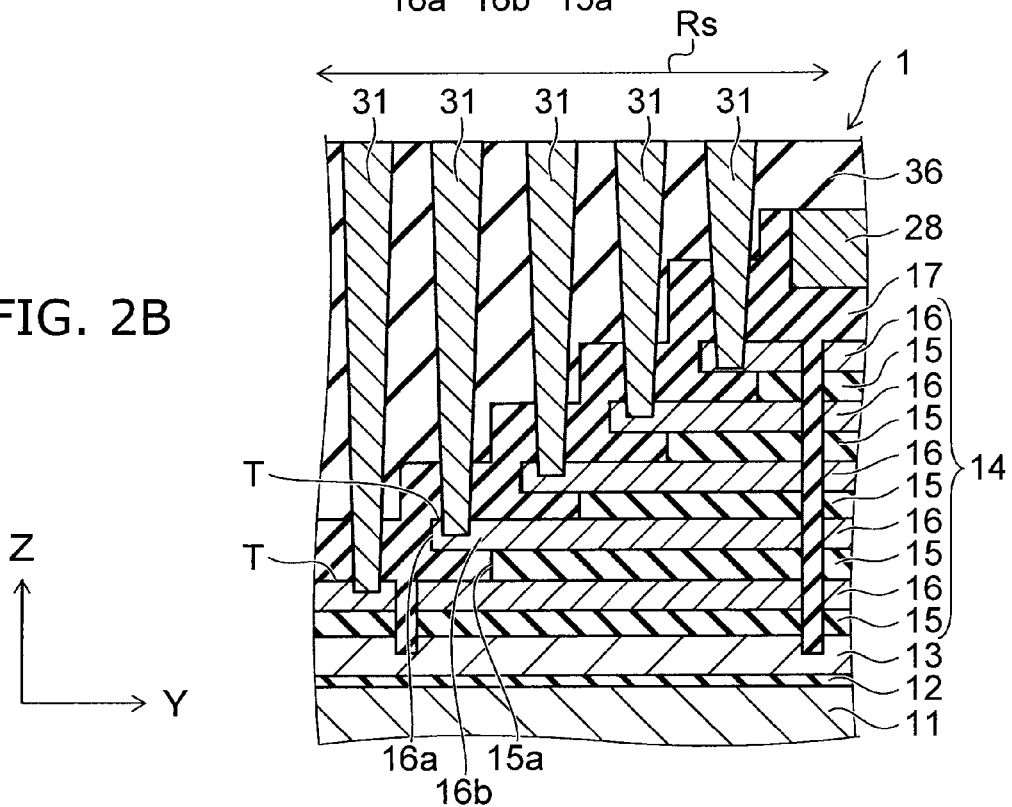

FIGS. 2A and 2B are cross-sectional views perpendicular to each other illustrating stairs region of the semiconductor device according to the embodiment.

As illustrated in FIG. 1 and FIGS. 2A and 2B, a semiconductor device according to the embodiment (hereinafter, simply referred to as "device") 1 is a stacked-type non-volatile semiconductor memory device. In the device 1, a memory region Rm in which memory cells that store data are formed, and a stairs region Rs where the contacts are taken out from the memory cells are set. In the device 1, a silicon substrate 11 formed from, for example, a single crystal of silicon is provided. In this patent specification, the following XYZ orthogonal coordinate system is introduced for convenience of explanation. In this coordinate system, two mutually perpendicular directions parallel to the upper face of the silicon substrate 11 are defined as the X-direction and the Y-direction, and the direction perpendicular to both the X-direction and the Y-direction is defined as the Z-direction, in other words, the vertical direction.

First, the memory region Rm is described.

As illustrated in FIG. 1, an insulating layer 12, a back gate electrode 13, and a stacked body 14 are provided on the silicon substrate 11. The stacked body 14 is configured by alternately stacking a plurality of insulating films 15 and electrode films 16. The insulating films 15 are formed from, for example, silicon oxide, and the electrode films 16 are formed from, for example, polysilicon. The electrode films 16 may be formed from metal. The electrode films 16 are divided along the Y-direction by an insulating member 39. The stacked body 14 is provided across the memory region Rm and the stairs region Rs.

A plurality of through holes 20 is formed in the portion of the stacked body 14 provided in the memory region Rm. The through holes 20 extend in the stacking direction (Z-direction) of the insulating films 15 and the electrode films 16, and pass through the stacked body 14. Also, the through holes 20 are arranged in a matrix form along the X-direction and the Y-direction, when viewed from the Z-direction. Two through holes 20 adjacent to each other in the Y-direction are linked to each other by a concave portion 13a formed in the upper face of the back gate electrode 13.

A block insulating layer 21 is formed on the inner faces of the through holes 20 and the concave portion 13a. The block insulating layer 21 is a layer through which a current does not substantially flow even when a voltage that is within the driving voltage range of the device 1 is applied, and is formed from silicon oxide, for example. A charge storage layer 22 is provided on the block insulating layer 21. The charge storage layer 22 is a layer that has the capability of accumulating charge, for example, a layer that includes electron trap sites, and is formed from, for example, silicon nitride. A tunnel insulating layer 23 is provided on the charge storage layer 22. The tunnel insulating layer 23 is a layer that is normally insulating, but when a predetermined voltage that is within the driving voltage range of the device 1 is applied, a tunnel current flows, and is formed from a silicon oxide, for example. A memory film 24 is formed by stacking the block insulating layer 21, the charge storage layer 22, and the tunnel insulating layer 23.

The insides of the through holes 20 and the concave portion 13a are filled with polysilicon. A silicon pillar 26 is formed by filling the through holes 20 with polysilicon. The shape of the silicon pillars 26 is a columnar shape extending in the Z-direction, for example, a circular columnar shape. On the other hand, a connecting member 27 is formed by filling the concave portion 13a with polysilicon. Two silicon pillars 26 adjacent to each other in the Y-direction are connected to each other by the connecting member 27.

A selection gate electrode 28 extending in the X-direction is provided on the stacked body 14, a source line 29 extending in the X-direction is provided on the selection gate electrode 28, and a bit line 30 extending in the Y-direction is provided on the source line 29. Also, one of the two silicon pillars 26 connected to each other by the connecting member 27 passes through the selection gate electrode 28 and is connected to the source line 29, and the other passes through the selection gate electrode 28 and is connected to the bit line 30. As a result of this configuration, a charge storage layer 22 is disposed between the electrode film 16 and the silicon pillar 26, and at each intersection portion between the electrode film 16 and the silicon pillar 26, a memory cell is configured. As a result, in the memory region Rm, a plurality of memory cells is arranged in a 3-dimensional matrix form within the stacked body 14.

Next, the stairs region Rs is described.

As illustrated in FIGS. 2A and 2B, the end portion 14a of the stacked body 14 is disposed in the stairs region Rs. The end portion 14a is processed in a stairs form, and a terrace T is formed for each pair of one insulating film 15 and one electrode film 16. The terrace T is disposed in grid form along both the X-direction and the Y-direction. In the terrace T at each step, the insulating film 15 is disposed in the lower layer and the electrode film 16 in the upper layer. Also, an end face 15a of the insulating film 15 is set back toward the inside of the stacked body 14 more than an end face 16a of the electrode film 16. Therefore, the lower face of an end portion 16b of the electrode film 16 does not contact the insulating film 15.

An insulating stopper film 17 is provided on the end portion 14a of the stacked body 14. The stopper film 17 penetrates between the end portions 16b of the electrode films 16, and is in contact with the upper face and the lower face of the end portions 16b. Also, the composition of the stopper film 17 is different from the composition of the insulating films 15. If the etching conditions are appropriately selected, the etching selectivity of the stopper film 17 with respect to the electrode film 16 is higher than the etching selectivity of the insulating film 15 with respect to the electrode film 16. The stopper film 17 is formed from, for example, silicon nitride.

An interlayer insulating film 36 is provided covering the stacked body 14. The selection gate electrode 28, the source line 29, and the bit line 30 as described above are embedded in the interlayer insulating film 36. The interlayer insulating film 36 is also disposed on the end portion 14a of the stacked body 14. The composition of the interlayer insulating film 36 is different from the composition of the stopper film 17. For example, the interlayer insulating film 36 is formed from silicon oxide.

A plurality of contacts 31 is provided within the interlayer insulating film 36 and the stopper film 17. Each of the contacts 31 passes through the interlayer insulating film 36, and passes through the portion of the stopper film 17 provided on the electrode film 16 of each terrace T, and is connected to each of the electrode films 16. A main body portion (not illustrated on the drawings) and a barrier metal layer (not illustrated on the drawings) provided on a side face and a lower face of the main body part are provided in the contacts 31. The main body part is formed from a metal material such as tungsten or copper or the like, and the barrier metal layer is formed from an electrically conductive material such as, for example, titanium or titanium nitride or the like.

Next, a manufacturing method for the semiconductor device according to the embodiment will be described.

FIGS. 3A and 3B to FIGS. 8A and 8B are cross-sectional views illustrating a method for manufacturing the semiconductor device according to the embodiment.

First, as illustrated in FIG. 1, the insulating layer 12 and the back gate electrode 13 are formed on the silicon substrate 11. Next, the concave portion 13a is formed on the upper face of the portion of the back gate electrode 13 disposed on the memory region Rm, and the interior of the concave portion 13a is filled with sacrificial material (not illustrated on the drawings). Next, the insulating films 15 formed from, for example, silicon oxide, and the electrode films 16 formed from, for example, polysilicon, are stacked alternately to form the stacked body 14. Next, slits 38 extending in the X-direction are formed in the stacked body 14 and the selection gate electrode 28, and filled with the insulating member 39. In this way, the electrode film 16 is divided along the Y-direction.

Next, through holes 20 extending in the Z-direction are formed in the portion of the stacked body 14 disposed on the memory region Rm, reaching as far as both end portions of the concave portion 13a. Next, the sacrificial material is removed from within the concave portion 13a, and the block insulating layer 21, the charge storage layer 22, and the tunnel insulating layer 23 are formed in this order on the inner face of the through holes 20 and the concave portion 13a. Next, the connecting member 27 and the silicon pillars 26 are formed by filling the inside of the concave portion 13a and the through holes 20 with polysilicon. Next, the selection gate electrode 28 is formed on the stacked body 14.

Next, as illustrated in FIGS. 3A and 3B, a resist film (not illustrated on the drawings) is formed on the selection gate electrode 28. Next, etching using the resist film as a mask and trimming the resist film are carried out alternatively. This is carried out along both the X-direction and the Y-direction. In this way, the terraces T are formed in grid form in the end portion 14a of the stacked body 14 for every pair of one electrode film 16 and one insulating film 15. In other words, the end portion 14a of the stacked body 14 is processed into a stairs form in two directions.

Figure 4A:
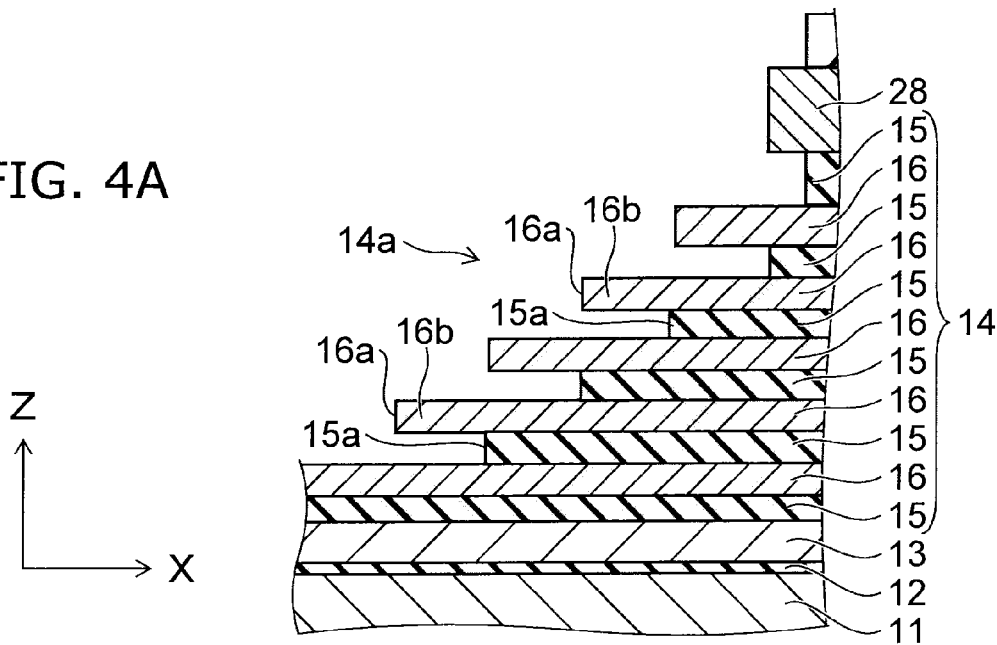
Figure 4B:
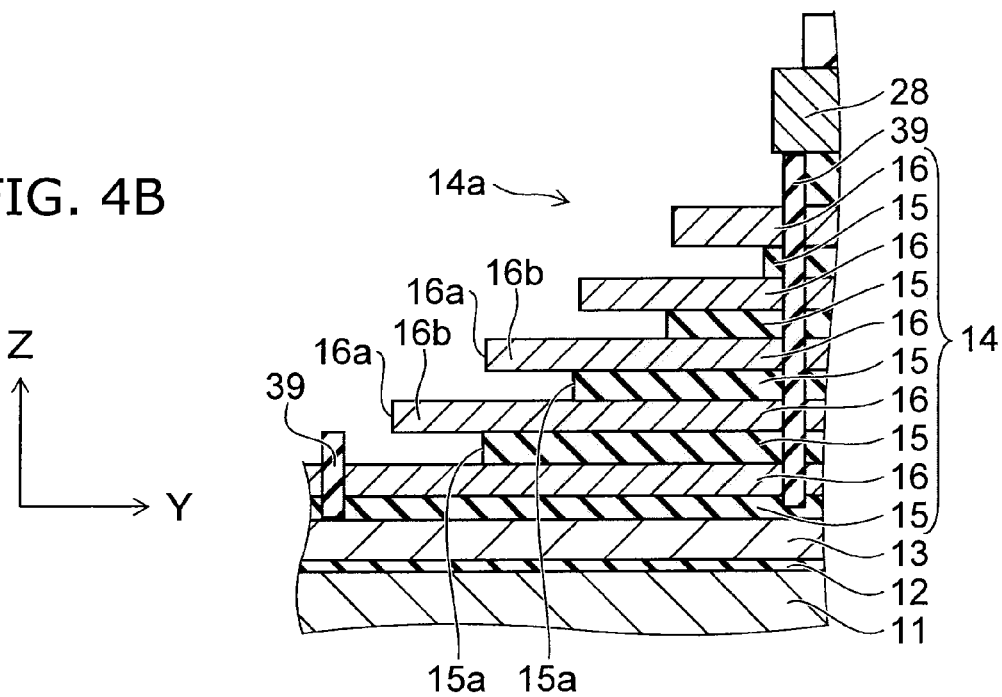

Next, as illustrated in FIGS. 4A and 4B, wet etching for example is carried out to remove the insulating films 15 from the end portion 14a of the stacked body 14. For example, diluted hydrofluoric acid (DHF) is used as the etchant for wet etching. In this way, the end face 15a of the insulating films 15 are set back, and the insulating film 15 is removed from the region directly below the end portion 16b of the electrode film 16 in each terrace T. At this time, the amount that the end face 15a of the insulating film 15 is set back is not less than the length of the diameter of the bottom end portion of the contacts 31 (see FIGS. 2A and 2B) formed in a later process plus a margin for deviation when forming the contacts 31.

Figure 5A:
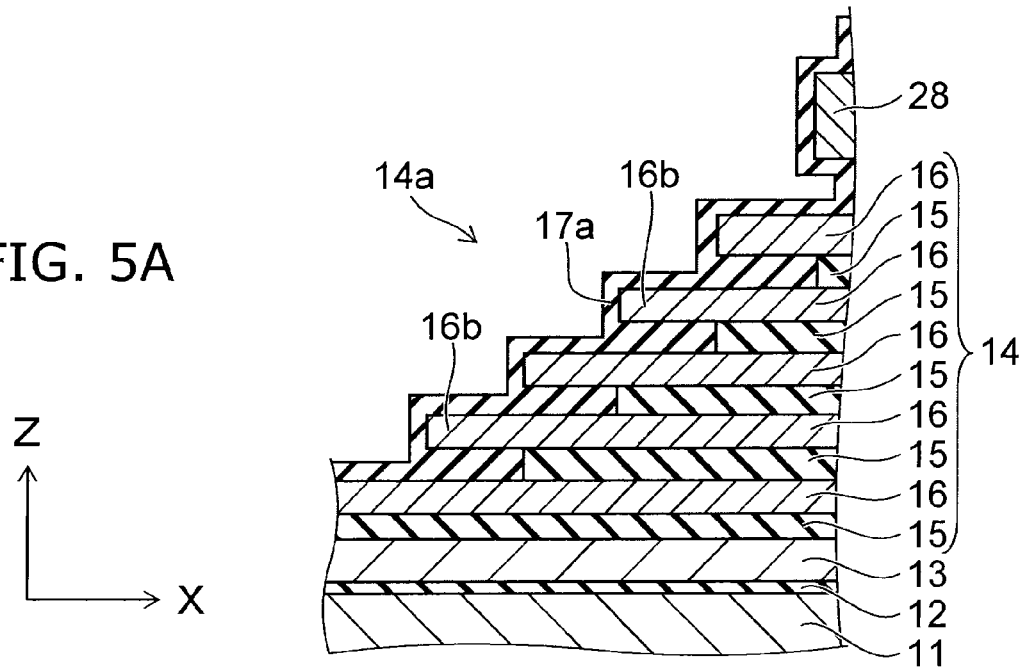
Figure 5B:
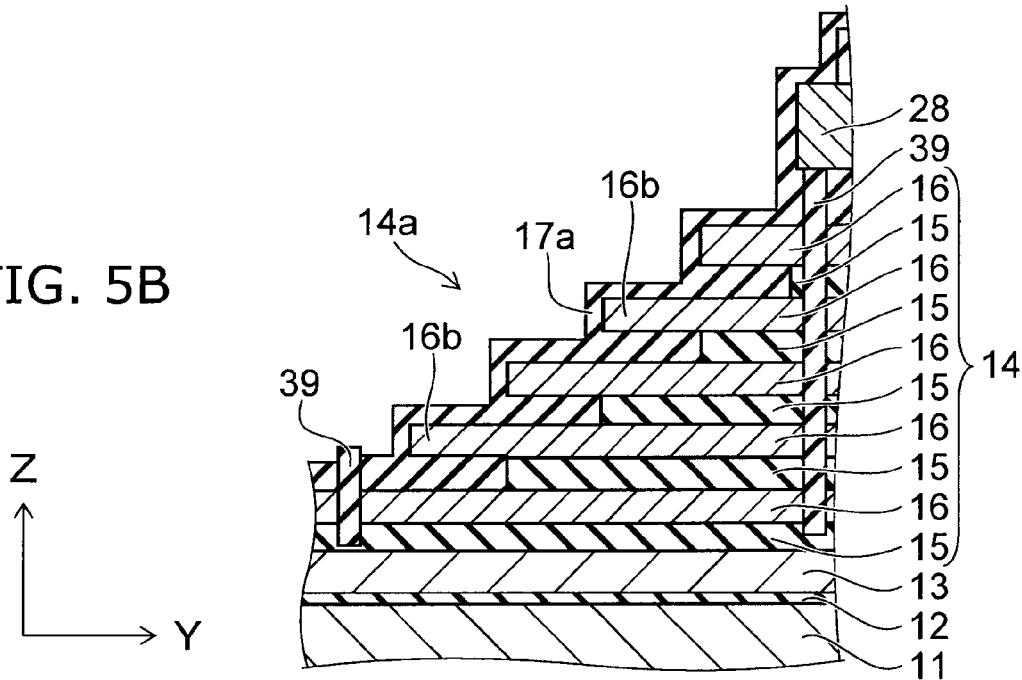

Next, as illustrated in FIGS. 5A and 5B, silicon nitride (SiN) is deposited by, for example, the low-pressure chemical vapor deposition (LP-CVD) or atomic layer deposition (ALD) method. In this way, a bottom layer film 17a of the stopper film is formed in contact with the upper face and the lower face of the end portion 16b of the electrode film 16. At this time, the bottom layer film 17a also fills the space after removal of the insulating film 15 in the process illustrated in FIG. 3B, in other words, the gap between the end portion 16b of the electrode film 16 of each step and the electrode film 16 one step below. In this way, the bottom layer film 17a is disposed in the region directly below the end portion 16b of the electrode film 16 in each terrace T.

Figure 6A:
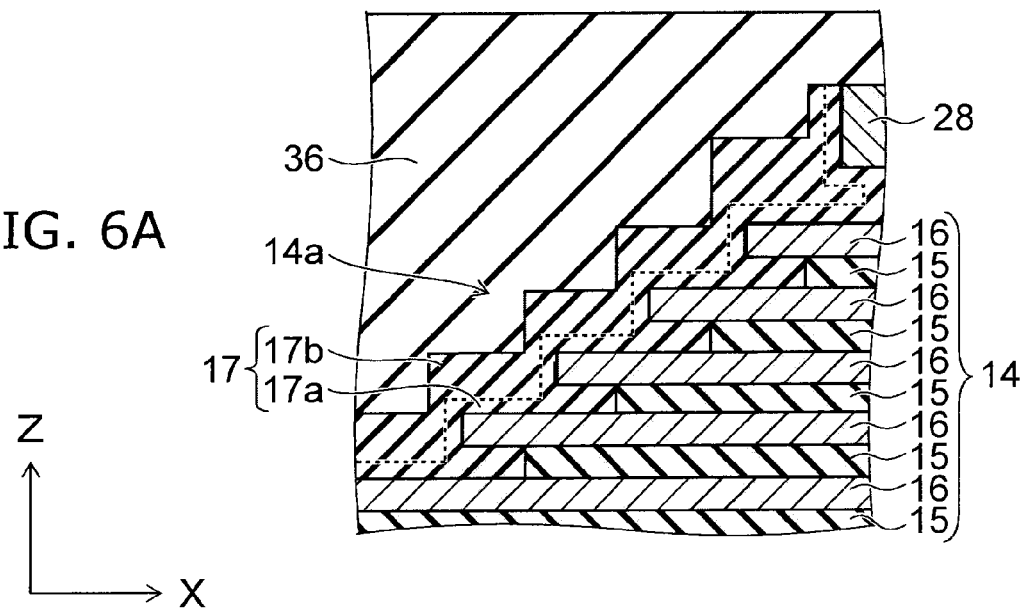
Figure 6B:
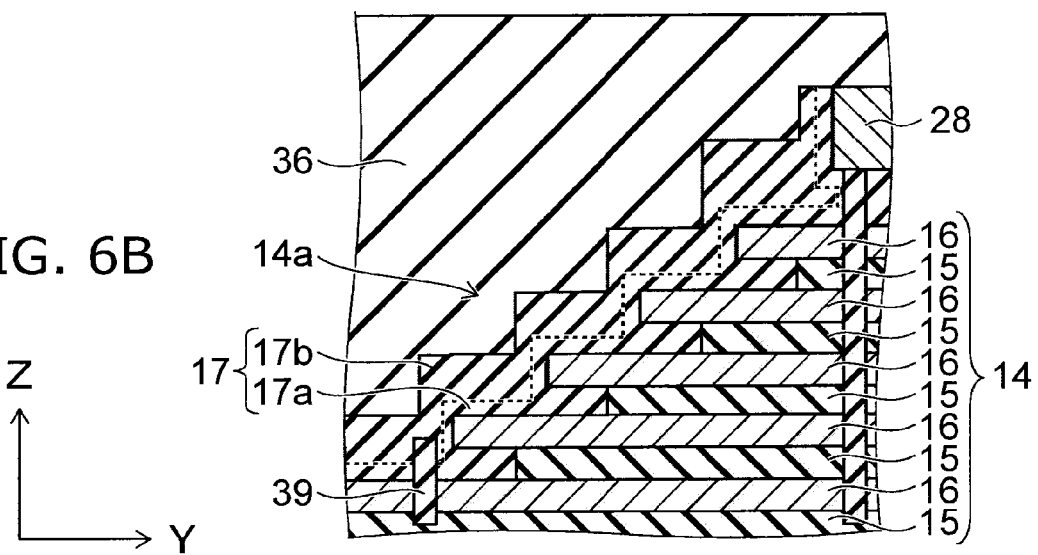

Next, as illustrated in FIGS. 6A and 6B, silicon nitride of the same type as the bottom layer film 17a is deposited. In this way, a top layer film 17b of the stopper film is formed covering the whole end portion 14a of the stacked body 14. The stopper film 17 is formed by the bottom layer film 17a and the top layer film 17b. The stopper film 17 may be formed from metal oxide such as tantalum oxide (TaO) or hafnium oxide (HfO) or the like, but not silicon nitride.

Next, silicon oxide is deposited by the CVD method using, for example, TEOS (tetra ethyl ortho silicate: $Si(OC_2H_5)_4$) as raw material, and the interlayer insulating film 36 is formed covering the stacked body 14. The interlayer insulating film 36 is also formed on the end portion 14a of the stacked body 14. The interlayer insulating film 36 may be formed from, for example, non dope silicate glass (NSG). Alternatively, the interlayer insulating film 36 may be formed by the high density plasma (HDP)-CVD method, or may be formed using polysilazane as the raw material. Next, chemical mechanical polishing (CMP) is carried out on the upper face of the interlayer insulating film 36 to flatten it.

Figure 7A:
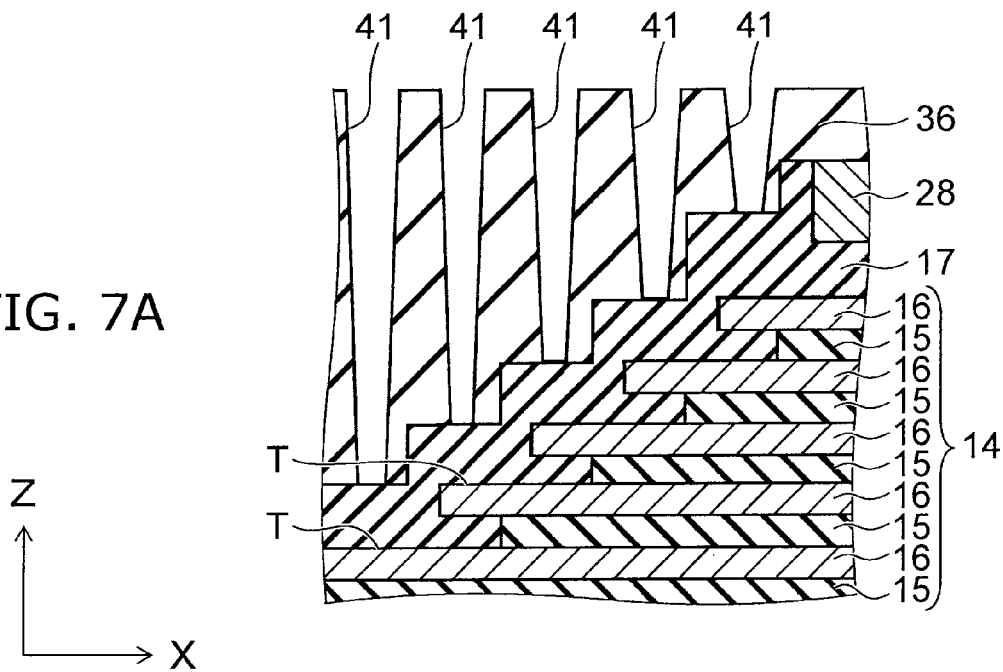
Figure 7B:
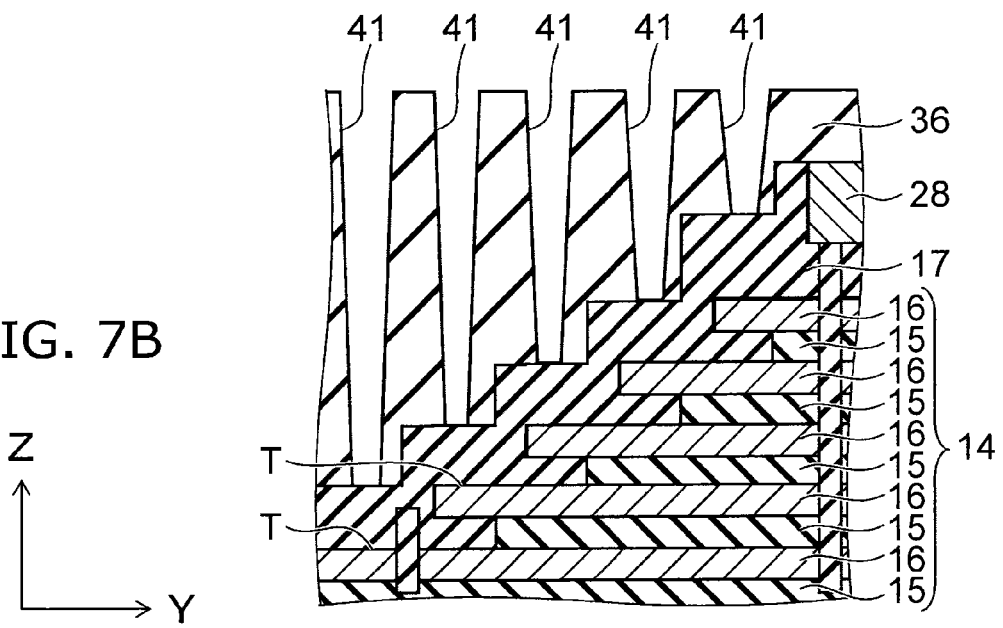

Next, as illustrated in FIGS. 7A and 7B, contact holes 41 are formed in the region directly above each terrace T in the interlayer insulating film 36 by carrying out reactive ion etching (RIE) of the interlayer insulating film 36 using the stopper film 17 as a stopper. At this time, a $(C_xF_y/Ar/O_2)$ mixed gas, for example, $(C_4F_8/C_4F_6/Ar/O_2)$ mixed gas is used as the etching gas.

Figure 8A:
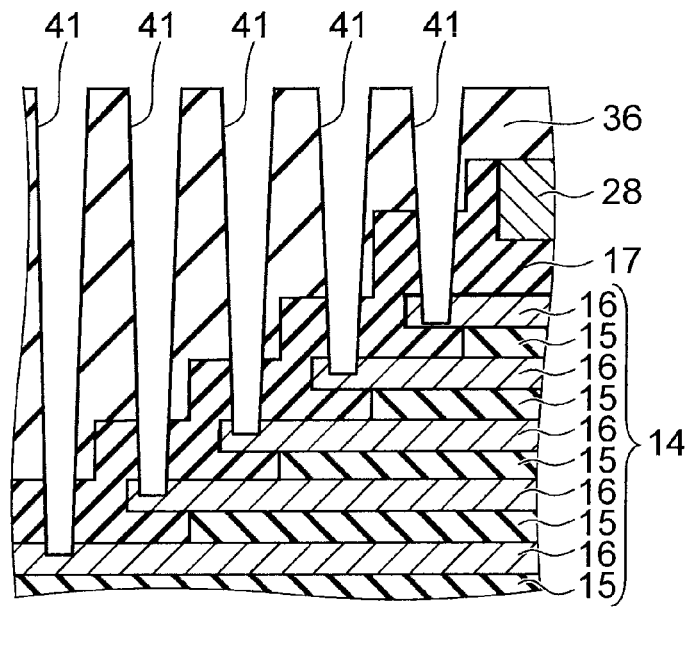
Figure 8B:
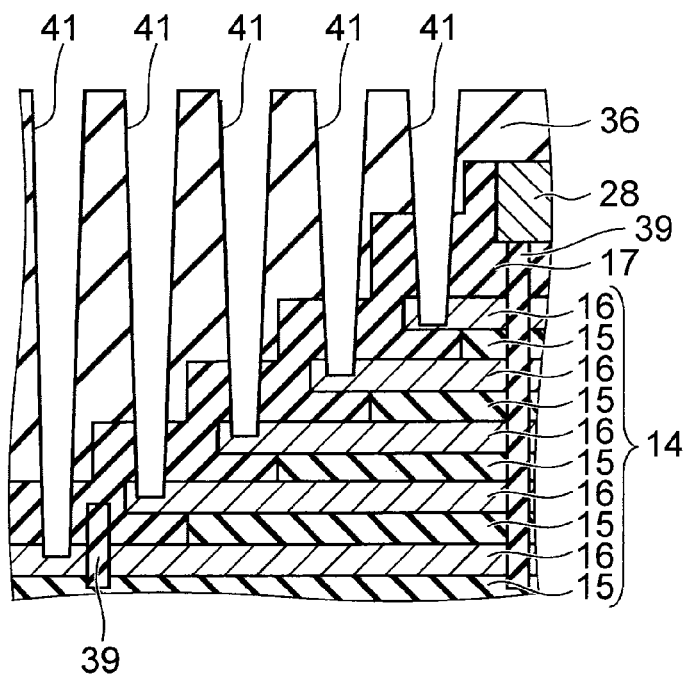

Next, as illustrated in FIGS. 8A and 8B, the contact holes 41 are extended into the portion of the stopper film 17 provided above the end portion 16b of the electrode film 16, by carrying out RIE of the stopper film 17 via the contact hole 41, to reach the electrode film 16. This etching is carried out under conditions so that the etching selectivity of the stopper film 17 with respect to the electrode film 16 is higher than the etching selectivity of the insulating film 15 with respect to the electrode film 16. For example, $(CH_xF_y/Ar/O_2)$ mixed gas, for example, $(CHF_3/CH_2F_2/Ar/O_2)$ mixed gas is used as the etching gas.

Next, as illustrated in FIGS. 2A and 2B, the barrier metal layer is formed, a metal film is formed, and then the metal film and the barrier metal layer deposited on the interlayer insulating film 36 are removed by carrying out CMP. In this way, the contacts 31 are embedded within the contact holes 41.

Next, as illustrated in FIG. 1, the source line 29 and the bit line 30 are formed in the memory region Rm. In this way, the semiconductor device 1 according to the embodiment is manufactured.

Next, the effects of the embodiment will be described.

In the embodiment, in the process illustrated in FIGS. 7A and 7B, when forming the contact holes 41 in the interlayer insulating film 36, by using the stopper film 17 formed from a different type of material to that of the interlayer insulating film 36 as a stopper, it is possible to prevent the contact hole 41 formed on the terrace T of the uppermost step from penetrating the electrode film 16 before the contact hole 41 is formed in the terrace T of the lowermost step. In this way, when the number of steps of the electrode film 16 is increased, it is possible to prevent some of the contact holes 41 from penetrating the electrode film 16, even when the contact holes 41 that reach each electrode film 16 are formed at the same time, and it is possible to avoid the contact 31 from short-circuiting two or more electrode films 16 adjacent to each other in the Z-direction. In this way, it is possible to prevent the contact 31 from short-circuiting electrode films 16, so it is possible to improve the reliability of the device 1, and at the same time, it is possible to form the contact holes 41 at the same time, so the manufacturing cost of the device 1 can be reduced.

Also, the stopper film 17 contacts the upper face of the end portion 16b of the electrode film 16, and the insulating film 15 is not interposed between the stopper film 17 and the end portion 16b. Therefore, in the process of forming the contact holes 41, after etching the stopper film 17, it is not necessary to etch the insulating film 15. As a result, the process of forming the contact holes can be simplified, and the manufacturing cost of the device 1 can be reduced.

Second Embodiment

Next a second embodiment will be described.

The embodiment differs from the first embodiment as described above in that the bottom layer film and the top layer film of the stopper film are formed from different materials or by different processes.

Figure 9A:
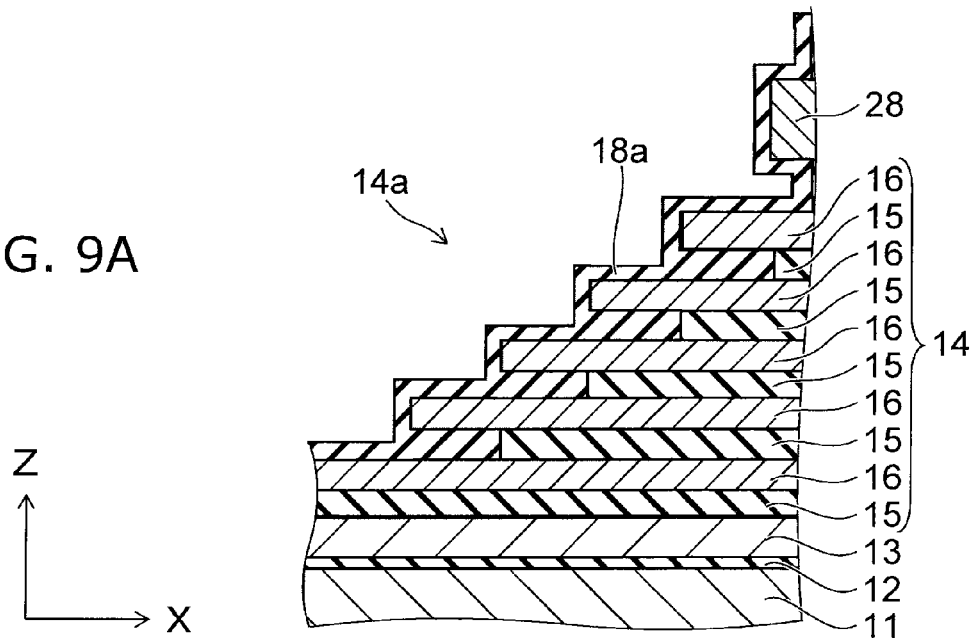
FIGS. 9A and 9B are cross-sectional views illustrating a method for manufacturing the semiconductor device according to a second embodiment.
Figure 9B:
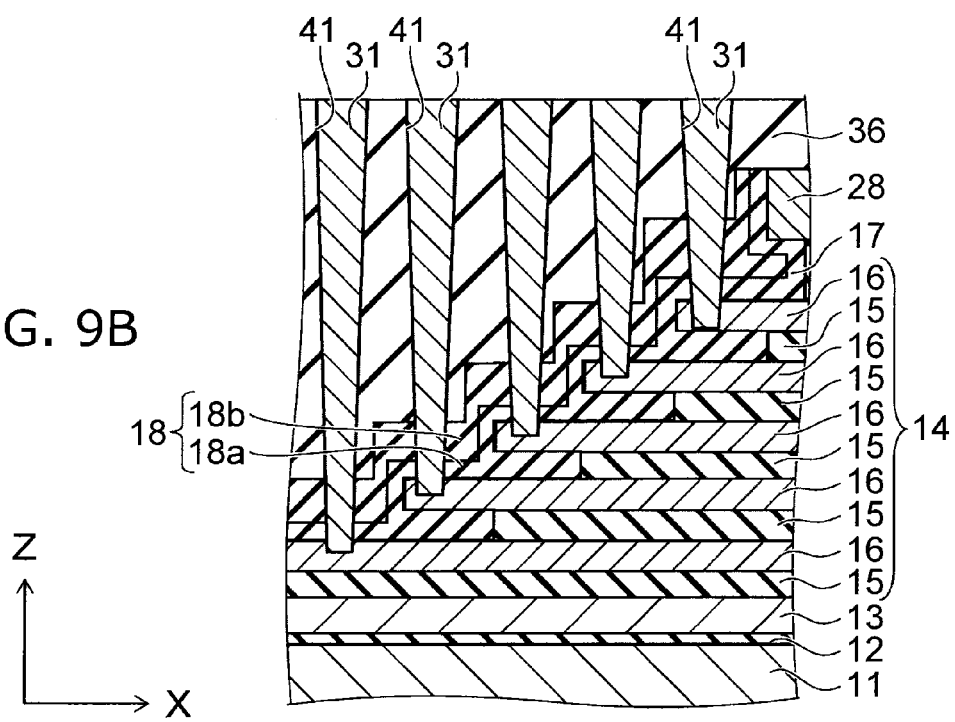

FIGS. 9A and 9B are cross-sectional views illustrating a method for manufacturing the semiconductor device according to the embodiment.

First, the process illustrated in FIGS. 3A and 3B and the process illustrated in FIGS. 4A and 4B are carried out.

Next, a bottom layer film 18a is formed as illustrated in FIG. 9A. The bottom layer film 18a is formed from, for example, a metal oxide, for example, tantalum oxide.

Next, a top layer film 18b is formed as illustrated in FIG. 9B. The top layer film 18b is formed from, for example, silicon nitride. A stopper film 18 is formed by the bottom layer film 18a and the top layer film 18b. The material of the bottom layer film 18a is selected so that the coatability is greater than that of the material of the top layer film 18b, and the etching selectivity of the bottom layer film 18a with respect to the electrode film 16 is higher than the etching selectivity of the top layer film 18b with respect to the electrode film 16.

Next, the interlayer insulating film 36 is formed, and the contact holes 41 are formed in the interlayer insulating film 36. Next, the top layer film 18b formed from silicon nitride is etched by carrying out RIE using, for example, ($CH_xF_y$/Ar/$O_2$) mixed gas as etching gas, to extend the contact holes 41 into the top layer film 18b. Next, The bottom layer film 18a formed from tantalum oxide is etched by carrying out RIE using $CF_4$ single gas as the etching gas, to extend the contact holes 41 into the bottom layer film 18a, to reach the electrode film 16. The subsequent processes are the same as for the first embodiment previously described.

According to the embodiment, by using a two layer configuration for the stopper film 18, when forming the contact holes 41, it is possible to obtain a higher etching selectivity with respect to the electrode film 16, and reliably prevent the contact holes 41 from penetrating the electrode film 16. The configuration, manufacturing method and effect of the embodiment other than that described above is the same as the first embodiment as described previously.

In the embodiment, an example is described in which the bottom layer film 18a and the top layer film 18b of the stopper film 18 were formed from different types of materials, but the different types of materials may be formed by different processes. For example, the bottom layer film 18a may be formed by depositing silicon nitride using the ALD method, and the top layer film 18b may be formed by depositing a silicon nitride film using the LP-CVD method. In this way, the contact holes 41 can be formed in the top layer film 18b and the bottom layer film 18a using the same etching gas, and the etching selectivity of the bottom layer film 18a with respect to the electrode film 16 can be higher than the etching selectivity of the top layer film 18b with respect to the electrode film 16.

Third Embodiment

Next, a third embodiment will be described.

Figure 10:
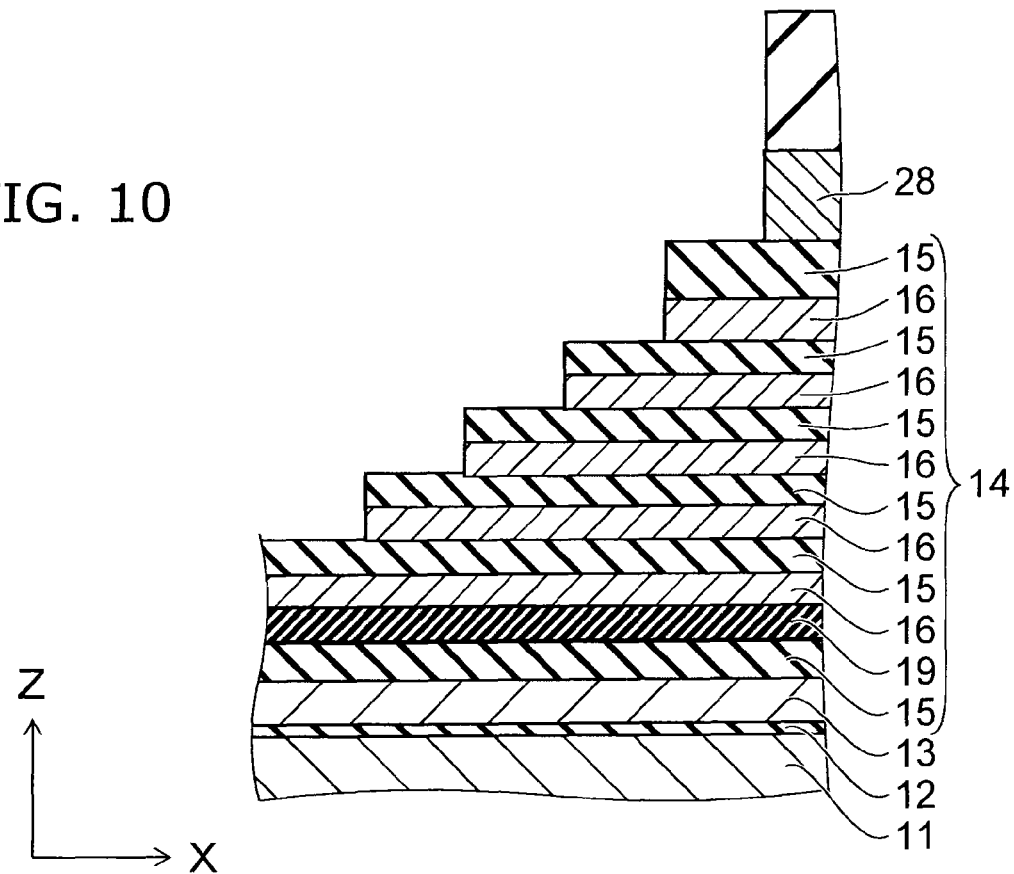
FIG. 10 is cross-sectional view illustrating a method for manufacturing the semiconductor device according to a third embodiment.

FIG. 10 is a cross-sectional view illustrating a method for manufacturing the semiconductor device according to the embodiment.

As illustrated in FIG. 10, in the embodiment, after forming the insulating layer 12 and the back gate electrode 13 on the silicon substrate 11, the first layer of insulating film 15 is formed. Next, a stopper film 19 is formed. The material and method for forming the stopper film 19 are the same as those of the stopper film 17. Next, the stacked body 14 is formed by alternately stacking the electrode film 16 formed from, for example, polysilicon, and the insulating film 15 formed from silicon oxide. The subsequent processes are the same as for the first embodiment previously described.

According to the embodiment, the stopper film 19 is provided between the back gate electrode 13 and the electrode film 16 of the lowermost step, so it is possible to reliably prevent the contact holes 41 from penetrating as far as the back gate electrode 13 or the silicon substrate 11. The configuration, manufacturing method and effect of the embodiment other than that described above is the same as the first embodiment as described previously.

Fourth Embodiment

Next, a fourth embodiment will be described.

Figure 11:
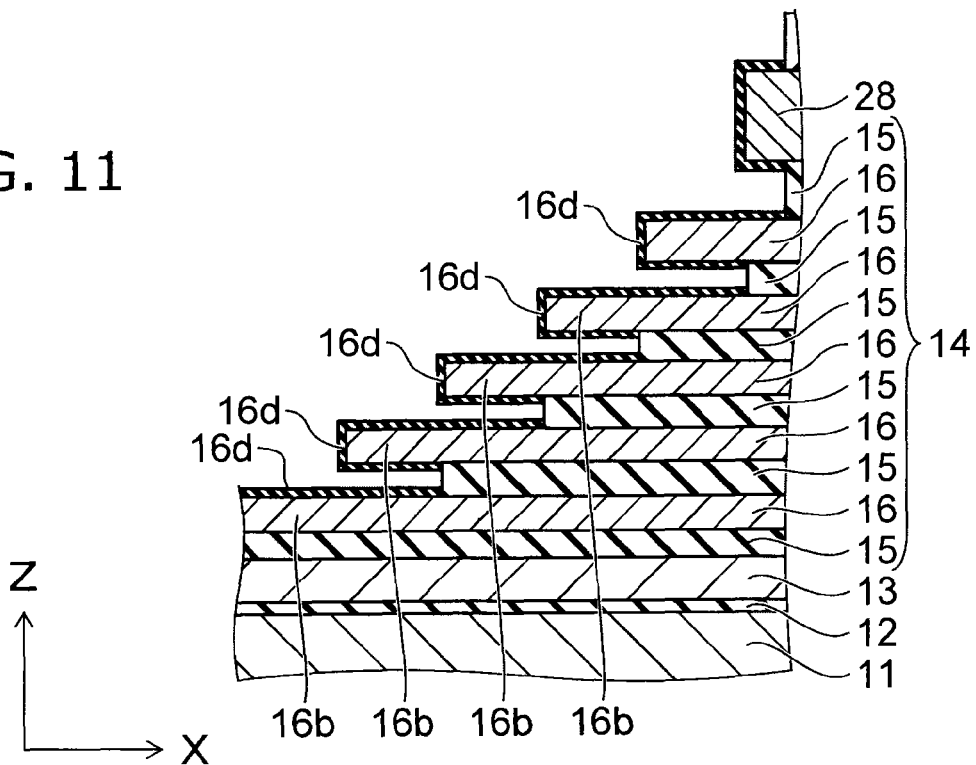
FIG. 11 is cross-sectional view illustrating a method for manufacturing the semiconductor device according to a fourth embodiment.

FIG. 11 is a cross-sectional view illustrating a method for manufacturing the semiconductor device according to the embodiment.

First, the process illustrated in FIGS. 3A and 3B and the process illustrated in FIGS. 4A and 4B are carried out.

Next, a thermal oxidization process is carried out on the electrode films 16 formed from polysilicon, as illustrated in FIG. 11. In this way, a thin silicon oxide layer 16d is formed on the exposed surface of the electrode film 16, and the roughness of the exposed surface of the electrode film 16 is reduced. Thereafter, the silicon oxide layer 16d may be removed.

The subsequent processes are the same as for the first embodiment previously described. In other words, the processes illustrated in FIGS. 5A and 5B to FIGS. 8A and 8B are performed.

According to the embodiment, it is possible to reduce the contact resistance between the contacts 31 and the electrode film 16 by flattening the region of the upper face of the electrode film 16 in contact with the contact 31. The configuration, manufacturing method and effect of the embodiment other than that described above is the same as the first embodiment as described previously.

In each of the embodiments described above, an example of a "U-type" configuration was described, in other words, a configuration was described as an example in which the source line 29 and the bit line 30 are both disposed above the stacked body 14, the two adjacent silicon pillars 26 are connected together by the connecting member 27, one silicon pillar 26 is connected to the source line 29, and the other one silicon pillar 26 is connected to the bit line 30. However, this invention is not limited to this, for example, the device may be "I-type", in other words, a configuration in which the source line 29 is disposed below the stacked body 14, the bit line 30 is disposed above the stacked body 14, the bottom end of each silicon pillar 26 is connected to the source line 29, and the top end of each silicon pillar 26 is connected to the bit line 30 may be used.

According to the embodiments described above, it is possible to realize a highly reliable semiconductor device with low manufacturing cost and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device, comprising:
   a stacked body including alternatively stacked electrode films and first insulating films, and having an end portion in which a terrace is formed for each pair of one of the electrode films and one of the first insulating films, wherein an end face of each of the first insulating films is set back relative to an end face of an adjacent electrode film;
   a second insulating film covering the upper faces and lower faces of the electrode films in the end portion of the stacked body, and having a composition different from the composition of the first insulating film;
   a third insulating film provided on the end portion of the stacked body, having a composition different from the composition of the second insulating film; and a plurality of contacts, each of the plurality of contacts passing through the third insulating film and the second insulating film and contacting each of the electrode films.

2. The device according to claim 1, wherein the etching selectivity of the second insulating film with respect to the electrode films is higher than the etching selectivity of the first insulating film with respect to the electrode films.

3. The device according to claim 1, wherein the electrode films contain silicon.

4. The device according to claim 1, wherein the first insulating film and the third insulating film contain silicon oxide, and the second insulating film contains silicon nitride.

5. The device according to claim 1, wherein the second insulating film includes:
a bottom layer film contacting the electrode films; and
a top layer film provided on the bottom layer film,
the etching selectivity of the bottom layer film with respect to the electrode films is higher than the etching selectivity of the top layer film with respect to the electrode films.

6. The device according to claim 5, wherein the etching selectivity of the second insulating film with respect to the electrode films is higher than the etching selectivity of the first insulating film with respect to the electrode films.

7. The device according to claim 5, wherein the bottom layer film contains a metal oxide, and the top layer film contains silicon nitride.

8. The device according to claim 1, further comprising:
a substrate; and
a fourth insulating film provided on the substrate, having a composition different from the composition of the first insulating film,
wherein
the electrode films are provided on the fourth insulating film.

9. The device according to claim 1, further comprising:
a semiconductor pillar extending in a stacking direction of the stacked body, and passing through the stacked body; and
a charge storage layer provided between the semiconductor pillar and one of the electrode films.

10. A method for manufacturing a semiconductor device, comprising:
forming a stacked body by alternately stacking electrode films and first insulating films;
forming a terrace for each pair of one of the electrode films and one of the first insulating films in an end portion of the stacked body;
removing the first insulating films from the end portion of the stacked body such that an end face of each of the first insulating films is set back relative to an end face of an adjacent electrode film;
forming a second insulating film having a composition different from the composition of the first insulating film so as to contact upper faces and lower faces of the end portions of the electrode films;
forming a third insulating film having a composition different from the composition of the second insulating film on the end portion of the stacked body;
forming a plurality of contact holes at the same time that pass through the third insulating film and the second insulating film from above and reach each of the electrode films; and
filling the contact holes with electrically conductive material, the forming the contact holes including etching under the condition so that the etching selectivity of the second insulating film with respect to the electrode films is higher than the etching selectivity of the first insulating films with respect to the electrode films.

11. The method according to claim 10, wherein
in the forming the stacked body, the electrode films are formed from a material that contains silicon,
in the forming the second insulating film, the second insulating film is formed from a material that contains silicon nitride,
in the forming the third insulating film, the third insulating film is formed from a material that contains silicon oxide,
the forming the contact holes includes:
etching the third insulating film using $(C_xF_y/Ar/O_2)$ mixed gas; and
etching the second insulating film using $(CH_xF_y/Ar/O_2)$ mixed gas.

12. The method according to claim 10, wherein
the forming the second insulating film includes:
forming a bottom layer film; and
forming a top layer film on the bottom layer film,
the forming the contact holes includes etching under the condition so that the etching selectivity of the bottom layer film with respect to the electrode films is higher than the etching selectivity of the top layer film with respect to the electrode films.

13. The method according to claim 12, wherein
the forming the bottom layer film includes depositing silicon nitride by the atomic layer deposition method, and
forming the top layer film includes depositing silicon nitride by the low pressure chemical vapor deposition method.

14. The method according to claim 12, wherein
in the forming the bottom layer film, the bottom layer film is formed from a material that contains tantalum oxide,
in the forming the top layer film, the top layer film is formed from a material that contains silicon nitride, and
the forming the contact holes includes:
etching the top layer film using $(CH_xF_y/Ar/O_2)$ mixed gas; and
etching the lower layer film using $CF_4$ single gas.

15. The method according to claim 10, further comprising thermally oxidizing the electrode films after the removing the first insulating film and before the forming the second insulating film.

* * * * *